United States Patent
Kurusu (10) Patent No.: US 11,012,036 B2
(45) Date of Patent: May 18, 2021

(54) CURRENT REUSE TYPE FIELD EFFECT TRANSISTOR AMPLIFIER

(71) Applicant: Mitsubishi Electric Corporation, Tokyo (JP)

(72) Inventor: Hitoshi Kurusu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/481,024

(22) PCT Filed: Mar. 28, 2017

(86) PCT No.: PCT/JP2017/012641
§ 371 (c)(1),
(2) Date: Jul. 25, 2019

(87) PCT Pub. No.: WO2018/179088
PCT Pub. Date: Oct. 4, 2018

(65) Prior Publication Data
US 2020/0119694 A1    Apr. 16, 2020

(51) Int. Cl.
*H03F 1/02* (2006.01)
*H03F 1/34* (2006.01)
(Continued)

(52) U.S. Cl.
CPC ........... *H03F 1/0211* (2013.01); *H03F 1/342* (2013.01); *H03F 3/213* (2013.01); *G01S 7/032* (2013.01);
(Continued)

(58) Field of Classification Search
CPC ........ H03F 1/0211; H03F 1/342; H03F 3/213; H03F 2200/129; H03F 2200/267;
(Continued)

(56) References Cited

U.S. PATENT DOCUMENTS

| | | | |
|---|---|---|---|
| 8,264,279 B2* | 9/2012 | Anegawa | H03F 3/601 330/286 |
| 8,421,537 B2* | 4/2013 | Tsukashima | H03F 3/601 330/286 |

(Continued)

FOREIGN PATENT DOCUMENTS

JP    2012119794 A    6/2012

OTHER PUBLICATIONS

International Search Report issued in PCT/JP2017/012641; dated Jun. 27, 2017.

(Continued)

*Primary Examiner* — Hieu P Nguyen
(74) *Attorney, Agent, or Firm* — Studebaker & Brackett PC (57) ABSTRACT

A current reuse type FET amplifier according to the present invention has a capacitance provided between a drain of a first FET in a first stage and a gate of a second FET in a next stage, electrically separates a gate voltage of the second FET from a drain voltage of the first FET, and includes a control circuit controlling the gate voltage of the first FET and the gate voltage of the second FET so that a variation of a drain current of the second FET and a variation of a drain voltage of the first FET are reduced in accordance with a variation of a saturation current Idss of the FET. Furthermore, the current reuse type FET amplifier according to the present invention uses only a depression mode FET to provide a circuit configuration operable with a positive single power source.

6 Claims, 4 Drawing Sheets

(51) Int. Cl.
*H03F 3/213* (2006.01)
*H03F 3/60* (2006.01)
*G01S 7/03* (2006.01)

(52) U.S. Cl.
CPC .. *H03F 2200/129* (2013.01); *H03F 2200/267* (2013.01); *H03F 2200/451* (2013.01)

(58) Field of Classification Search
CPC ......... H03F 2200/451; H03F 2200/411; H03F 1/0283; H03F 3/193; H03F 1/0261; H03F 3/245; G01S 7/032; G01S 13/931
USPC .......................... 330/310, 98, 133, 150, 277
See application file for complete search history.

(56) References Cited

U.S. PATENT DOCUMENTS

| | | | |
|---|---|---|---|
| 10,090,816 B2* | 10/2018 | Fujita | H03F 3/601 |
| 10,116,273 B2* | 10/2018 | Tsukahara | H03F 1/0211 |
| 2012/0133441 A1 | 5/2012 | Tsukashima | |

OTHER PUBLICATIONS

K. Tsukashima et al., "E-Band Radio Link Communication Chipset in Cost Effective Wafer Level Chip Size Package (WLCSP) Technology", Proceedings of the 6th European Microwave Integrated Circuits Conference, Oct. 2011, pp. 29-32, Manchester, UK.

Kazuya Yamamoto, "A 1.8-V Operation 5-GHz-Band CMOS Frequency Doubler Using Current-Reuse Circuit Design Technique", IEEE Journal of Solid-State Circuits, Jun. 2005, pp. 1288-1295, vol. 40, No. 6.

* cited by examiner

CURRENT REUSE TYPE FIELD EFFECT TRANSISTOR AMPLIFIER

TECHNICAL FIELD

The present invention relates to a bias current control in a current reuse type field effect transistor (FET) amplifier using an FET in a depression mode.

BACKGROUND ART

Recently, there is an increasing demand of an in-vehicle radar using a microwave band or a milliwave band for purpose of an automatic drive or an impact reduction at a time of collision for a motor vehicle. A milliwave in 77 GHz band, which has favorable rectilinearity and comparatively hardly attenuates in rainy weather, is used in a remote monitoring of the in-vehicle radar. Often used in a circuit having a role of amplifying a power or converting a frequency of a signal of the radar is a power amplifier using a GaAs-based field effect transistor (a field effect transistor is referred to as an FET hereinafter), which is excellent in high output and high gain characteristics in a high frequency. (refer to Patent Document 1 (P.4, FIG. 1) or Non-Patent Document 1 (FIG. 9), for example)

PRIOR ART DOCUMENTS

Patent Documents

Patent Document 1: Japanese Patent Application Laid-Open No. 2012-119794

Non-Patent Documents

Non-Patent Document 1: 2011 Proc. Of the 6th European Microwave Integrated Circuits Conference, pp. 29-32, "E-Band Radio Link Communication Chipset in Cost Effective Wafer Level Chip Size Package (WLCSP) Technology"

Non-Patent Document 2: 2005 IEEE Journal of Solid-State Circuits, pp. 1288-1295, "A 1.8-V Operation 5-GHz-Band CMOS Frequency Doubler Using Current-Reuse Circuit Design Technique"

SUMMARY

Problem to be Solved by the Invention

Figure 6:
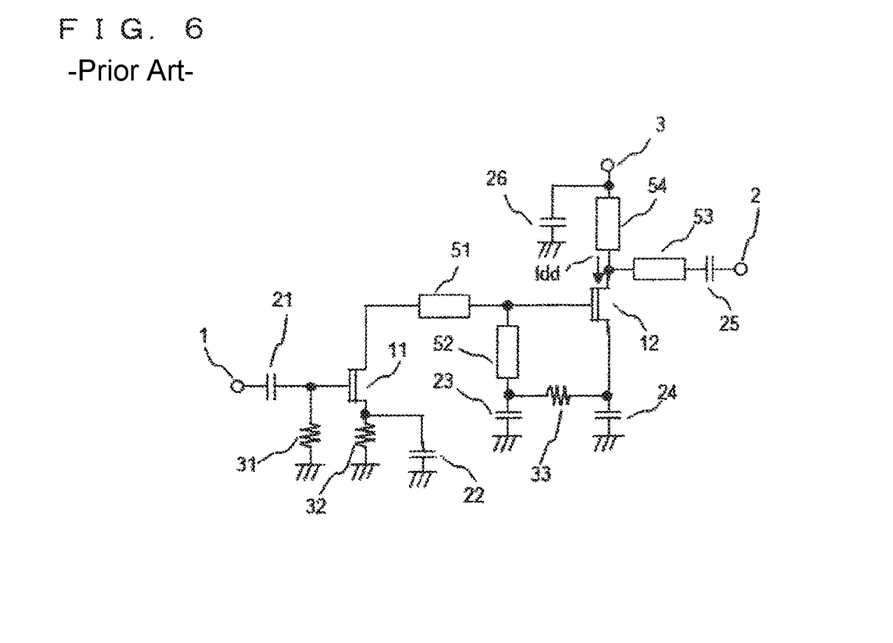
FIG. 6 A circuit configuration of a whole current reuse type FET amplifier for comparison.

Patent Document 1 and Non-Patent Document 1 indicate examples of a power amplifier using a GaAs-based FET. As indicated in the documents, selected is a circuit configuration which can be generally used in a vehicle and can operate with a single power source of 5V due to a limitation of being used in a vehicle, and a current reuse type circuit configuration is a typical example thereof. FIG. 6 illustrates a circuit configuration of a current reuse type amplifier using a GaAs-based FET. In FIG. 6, each of 11 and 12 is a GaAs-based FET (an HEMT referred to as a high-electron-mobility transistor is normally used) in a depression mode (normally-on), each of 31 to 33 is a resistance, each of 21 to 26 is a capacitance, each of 51 to 54 is a transmission line functioning similarly to an inductance, 1 is an input terminal of an RF signal, 2 is an output terminal of an RF signal, 3 is a power source terminal in an amplification unit, and Idd is a drain current flowing in the FET 12. Each of 22 and 24 is a capacitance for grounding sources of the FETs 11 and 12 in an RF manner and the capacitance 21 is a DC blocking capacitance of an input. The capacitance 23 and the transmission lines 51 and 52 form an interstage matching circuit, and the capacitances 25 and 26 and the transmission lines 53 and 54 form an output matching circuit and a drain power supply circuit of the FET 12. The resistance 31 functions to fix gate potential of the FET 11 to 0V in a DC manner, and the resistances 32 and 33 are resistances for auto-bias.

The bias is described next. The drain current Idd flowing in the FET 12 flows in the resistance 33, subsequently flows again as the drain current of the FET 11, and finally passes through the resistance 32 to flow to the ground. In the gate bias (the gate-to-source voltage) of the FET 11, the gate voltage is fixed to 0V by the resistance 31; thus the gate-to-source voltage of the FET 11 is auto-biased to have a negative value by a voltage of a product of the resistance 32 and the current Idd. The gate-to-source voltage of the FET 12 is also auto-biased to have a negative value by a product of the resistance 33 and the current Idd in the similar manner.

Figure 5:
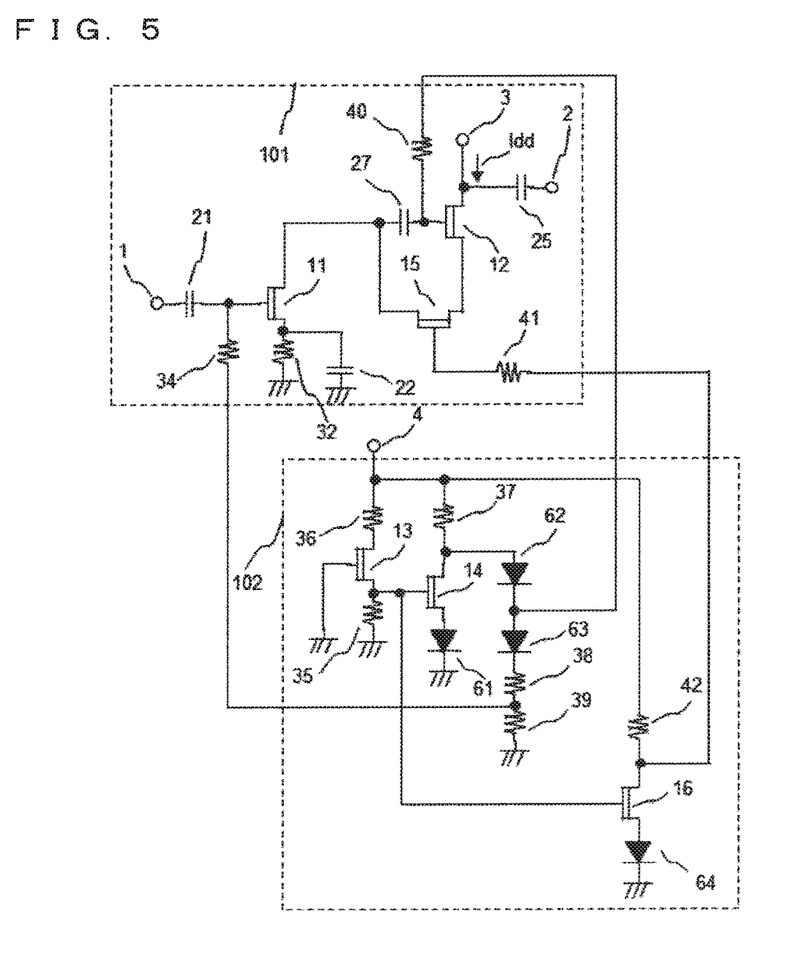
FIG. 5 A circuit configuration of a current reuse type FET amplifier according to an embodiment 2.

The current Idd flowing in the FET 12 flows again in also the FET 11; thus the circuit configuration described above is referred to as the current reuse type circuit. The FETs 11 and 12 also function to amplify the RF and are source-grounded in the RF manner by the capacitances 22 and 24; thus the circuit in FIG. 5 is equivalent to a two-stage amplifier of source ground. However, with regard to the current, the same Idd flows in the FETs 11 and 12 in common; thus the Idd suffices as the current consumed in the power source Vdd.

In the meanwhile, in a case of a normal source ground type two-stage amplifier where a power source voltage Vdd/2 is applied to each drain terminal of the FETs 11 and 12, when the current Idd flows in FETs 11 and 12, 2·Idd, which is twice the value in the current reuse type circuit, is consumed in the power source voltage Vdd/2. A current capacity of a battery is mainly limited in a battery-driven product; thus a consumption current can be reduced in many cases by adopting the current reuse type circuit.

The current reuse circuit is adopted to an RF amplification unit for the in-vehicle radar due to a limitation of a withstand voltage in the GaAs-based FET rather than the current reduction effect. The FET adaptable in the milliwave band has a short gate length of 0.2 μm or less; thus it has the drain-to-source withstand voltage equal to or smaller than 4V in the DC manner in many cases, 3V or so in some cases. Accordingly, voltage 5V in a standard power source mounted on a vehicle cannot be directly applied thereto in many cases. In the case of the current reuse circuit illustrated in FIG. 6, a DC applied voltage in one stage of FET is 2.5V, or half of 5V, and can be set to sufficiently lower than the withstand voltage of 4V; thus the power source voltage 5V can be used as a power source of an amplifier.

However, the GaAs-based FET is normally of depression mode, so that it is generally hard to constitute a bias circuit which can supply a constant drain current without depending on a process variation, compared with a CMOS-based or bipolar-based device in an enhancement mode. For example, a current reuse circuit described in Non-Patent Document 2 is an nMOS of enhancement mode; thus a current mirror type bias circuit resistant to the process variation can be adapted.

Figure 7:
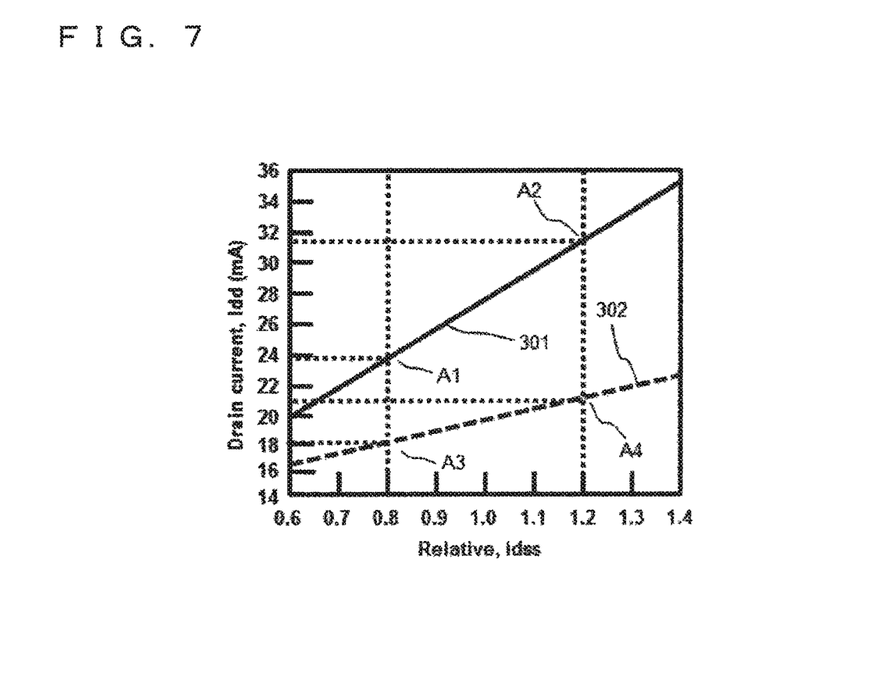
FIG. 7 A simulation result of a drain current Idd in accordance with a variation of an Idss in a circuit configuration of a current reuse type FET amplifier for comparison.

FIG. 7 illustrates a simulation result of a variation of the drain current Idd in the circuit in FIG. 6 in accordance with a variation of an Idss of the FET (a drain current of the FET at a time when the gate-to-source voltage is 0V). Used is a GaAs-based HEMT having a power source voltage of 5V and a gate length of 0.1 um. Plotted in FIG. 7 are a characteristic 301 and a characteristic 302 in cases where the values of the resistances 32 and 33 are small and large, respectively. Each of A1 to A4 in FIG. 7 indicates an intersection point between dotted lines. According to FIG. 7, the variation of the drain current Idd in the characteristic 301 in accordance with the variation of the Idss is larger than that in the characteristic 302. The drain current Idd shows a large variation ranging from 24 mA to 31.5 mA (changes by 27% with respect to the drain current of 27.5 mA at a time when the Idss is not varied) in the characteristic 301 with the variation of ±20% of the Idss; however, the drain current Idd shows a small variation ranging from 18 mA to 21 mA (changes by 15% with respect to the drain current of 19.5 mA at the time when the idss is not varied) in the characteristic 302. The drain current in the characteristic 302 has a small current variation but has a large resistance value; thus the drain current itself is small at the time when the Idss is not varied.

In the case of the milliwave band, the voltage is set to be a little lower than the gate voltage 0V (for example, −0.05V to −0.15V) to maximize the gain of the FET; thus the values of the resistances 32 and 33 are small. As a result, the auto-bias circuit alone is accompanied by the significant change of the drain current as illustrated in the characteristic 301 in FIG. 7. The significant change of the drain current varies the gain characteristics of the amplifier significantly; thus there is a problem of reducing the change. There have been reports regarding a bias circuit reducing the change of the Idss using a negative power source; however, it is difficult to provide a bias circuit operable with a positive single power source and to provide a circuit capable of reducing a change of a drain current in accordance with a process variation of an Idss, addressed by the present application.

Means to Solve the Problem

A current reuse type FET amplifier according to the present invention includes: a first field effect transistor including a first gate to which an RF signal is input, a first source, and a first drain; a first resistance connected between the first source and a ground terminal; a second field effect transistor including a second source, a second gate, and a second drain connected to a power source terminal and outputting an RF signal which has been amplified; a second resistance connected between the first drain and the second source; a capacitance connected between the first drain and the second gate; a third field effect transistor including a third source, a third drain connected to a power source terminal, and a third gate connected to the ground terminal; a fourth field effect transistor including a fourth source, a fourth drain, and a fourth gate connected to the third source; a first diode connected between the fourth source and the ground terminal; a third resistance connected between the power source terminal and the fourth drain; a fourth resistance connected between the fourth drain and the first gate; and a fifth resistance connected between the fourth drain and the second gate.

Effects of the Invention

The current reuse type FET amplifier according to the present invention changes a gate voltage of an amplifier FET or a resistance value for auto-bias of an amplifier FET in accordance with the process variation of the saturation current Idss of the FET, and thus has an effect of reducing the change of the drain current of the amplifier. Furthermore, a variation of a drain voltage of an FET in a first stage can also be reduced; thus a state where a voltage exceeds a drain-to-source DC withstand voltage of the FET corresponding to a process variation of an Idss can be prevented.

DESCRIPTION OF EMBODIMENT(S)

A current reuse type FET amplifier according to embodiments of the present invention is described with reference to the drawings. Including the drawings which have been described already, the same reference numerals will be assigned to the same or a corresponding constituent element and a repetitive description may be omitted in some cases. A GaAs-based depression mode FET (including an HEMT of a high-electron-mobility transistor) is described as an example hereinafter.

Embodiment 1

(Description of Configuration)

Figure 1:
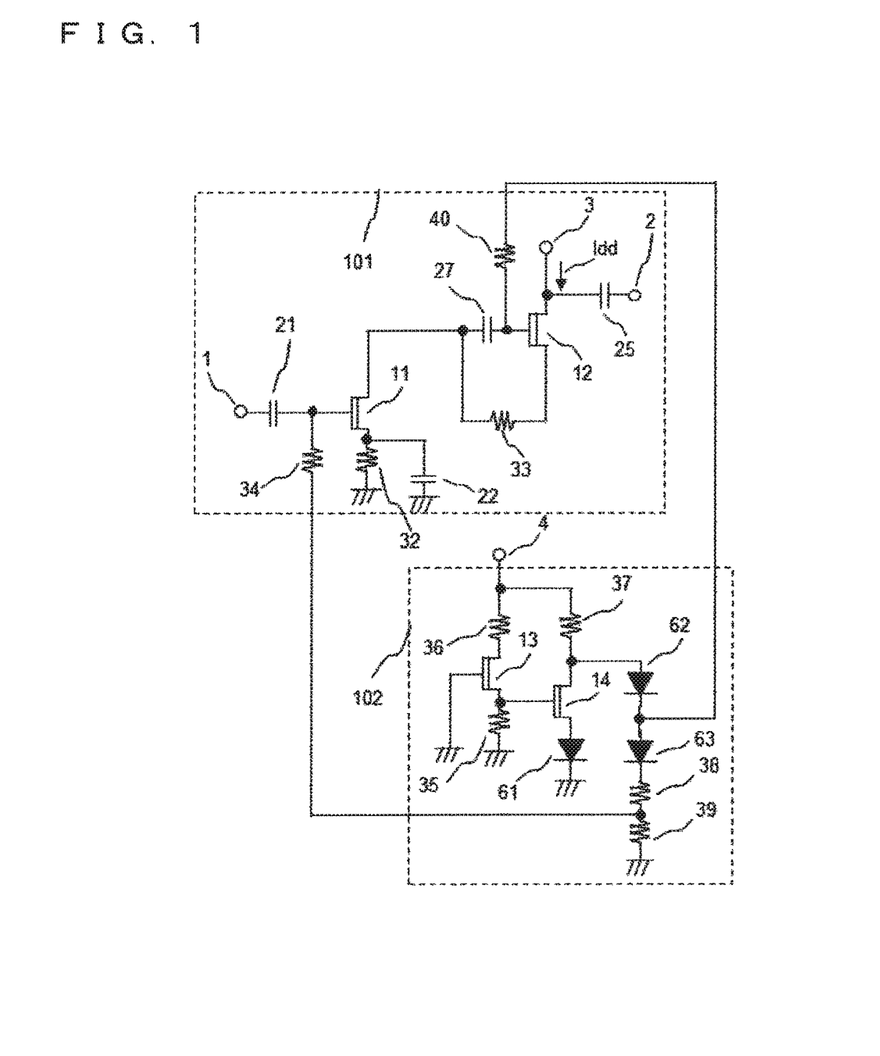
FIG. 1 A circuit configuration of a current reuse type FET amplifier according to an embodiment 1.

FIG. 1 illustrates a circuit configuration of an amplification unit 101 of a current reuse type FET amplifier and a circuit configuration of a control circuit unit 102 according to an embodiment 1 of the present invention. In FIG. 1, a transmission line, for example, is omitted and only elements contributing in a DC manner are mainly illustrated for simplifying the illustration. In the manner similar to FIG. 6, a resistance 32 and a capacitance 22 are parallelly connected between a source of an FET 11 and a ground to constitute a direct current negative feedback on a DC operation and a source ground on an RF operation. The drain current Idd flows in an FET 12 and subsequently flows as the drain current of the FET 11; thus the circuit in FIG. 1 is a current reuse circuit in the manner similar to the circuit in FIG. 6.

An RF signal being input to an input terminal 1 is amplified in the FET 11, and is further input to a gate of the FET 12 via a capacitance 27. The RF signal which has been amplified in the FET 12 is output from a drain of the FET 12 via a capacitance 25.

In the control circuit unit 102, an FET 13 includes a grounded gate with a resistance 35 as a source load and a resistance 36 as a drain load. An FET 14 includes a gate connected to a source of the FET 13 with a source load of a diode 61 and a drain load of a resistance 37. A load in which diodes 62 and 63 and resistances 38 and 39 are connected in series is connected between the drain of the FET 12 and a ground. The drain resistance loads 36 and 37 are connected to a power source terminal 4. The power source terminal 4 of the control circuit unit 102 may be in common with a power source terminal 3 of the amplification unit 101.

A control circuit 102 and the amplification unit 101 are connected by two control signals. A first control signal is supplied to a gate of the FET 11 via a resistance 34 connected between a connection point between the resistances 38 and 39 of the control circuit unit 102 and the gate of the FET 11. A second control signal is supplied to the gate of the FET 12 via a resistance 40 connected between a connection point between the diodes 62 and 63 of the control circuit unit 102 and the gate of the FET 12.

The diode in FIG. 1 is based on an assumption of a GaAs-based schottky junction diode manufacturable by the same process with the FET; however, an equivalent operation can also be achieved by a pn-junction diode.

(Description of Operation)

In order to reduce a change of the drain current Idd in FIG. 1 as much as possible in accordance with a change of a saturation current Idss of the FET due to the process variation, a gate voltage of the FET 11 needs to be reduced when the Idss exceeds a predetermined value, and in contrast, the gate voltage of the FET 11 needs to be increased when the Idss falls below a predetermined value. Moreover, in order to reduce a variation of a drain voltage of the FET 11 in addition to the reduction in the variation of the drain current Idd, as illustrated in FIG. 1, a gate voltage of the FET 12 needs to be separated from the drain voltage of the FET 11 using the capacitance 27 to appropriately control the gate voltage of the FET 12 in accordance with the process variation of the Idd.

The change of a source potential of the FET 14 of the control circuit unit 102 is reduced to be smaller than a change of the source current of the FET 14 by the diode 61 of the source load. Herein, plural stages of series connection of the diode 61 can be formed in accordance with a threshold voltage of the FET 14.

In the meanwhile, the source load of the FET 13 is the resistance 35; thus the source voltage of the FET 13 also increases in accordance with the increase in the Idss. Accordingly, the gate-to-source voltage of the FET 14 increases in accordance with the increase in the Idss, and the drain current of the FET 14 also increases. As a result, a voltage drop of the drain load resistance 37 increases and the drain voltage of the FET 14 decreases. Firstly, the decrease in the drain voltage is level-shifted in the diode 62 and transmitted to the gate of the FET 12 via the resistance 40, and secondly, the decrease is level-shifted in the diodes 62 and 63, and subsequently divided in the resistances 38 and 39 to be transmitted to the gate of the FET 11 via the resistance 34.

The current reuse FET amplifier according to the embodiment 1 can control the gate voltage of the FET 11 and the gate voltage of the FET 12 independently from each other in accordance with the process variation of the Idss, and thus can reduce not only the variation of the drain current Idd but also the variation of the drain voltage of the FET 11. As a result, the current reuse FET amplifier according to the embodiment 1 can reduce the variation of the gain in accordance with the process variation of the Idss and further does not have a trouble caused by a withstand voltage excess even when a drain-to-source DC withstand voltage is not sufficient with respect to a half of the power source voltage; thus a stable operation can be expected.

(Description of Difference from Comparison Circuit)

Figure 2:
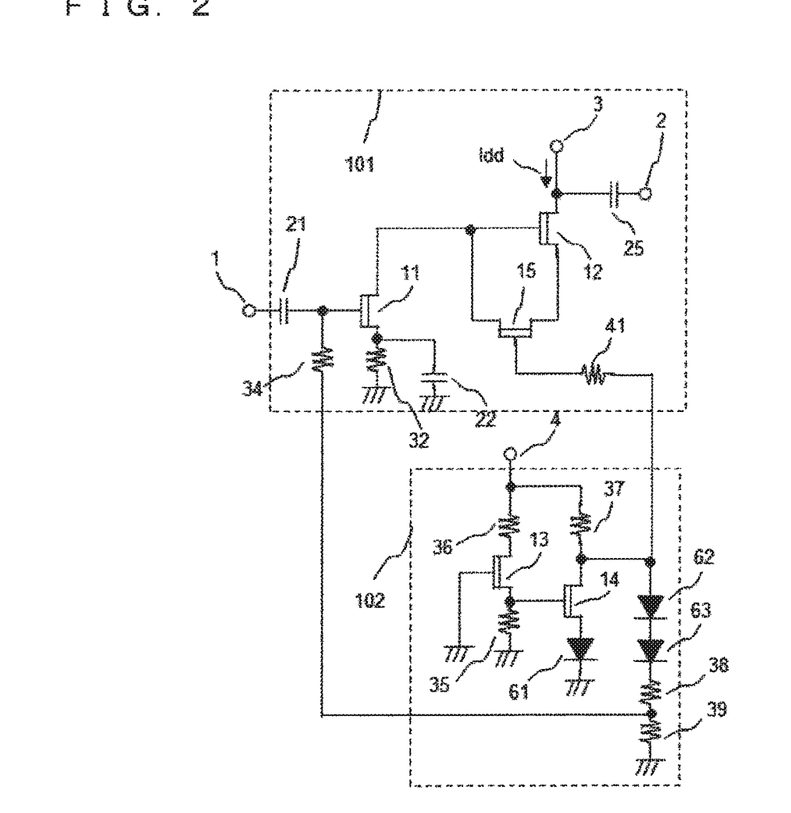
FIG. 2 Another circuit configuration for comparison with the current reuse type FET amplifier according to the embodiment 1.

Described next is a difference between the circuit according to the embodiment 1 and a comparison circuit. FIG. 2 illustrates a circuit configuration of the comparison circuit. The comparison circuit in FIG. 2 is different from the circuit in FIG. 1 mainly in that there is no capacitance 27 separating the drain voltage of the FET 11 from the gate voltage of the FET 12, so that the FET 11 and the FET 12 are directly connected to each other in the manner similar to the circuit in FIG. 6, and there are an FET 15 and a gate resistance 41 which function as a variable resistance in place of the resistance 33. A variable resistance value of a gate voltage of the FET 15 is controlled from the drain voltage of the FET 14 of the control circuit unit 102 via the resistance 41.

Figure 3:
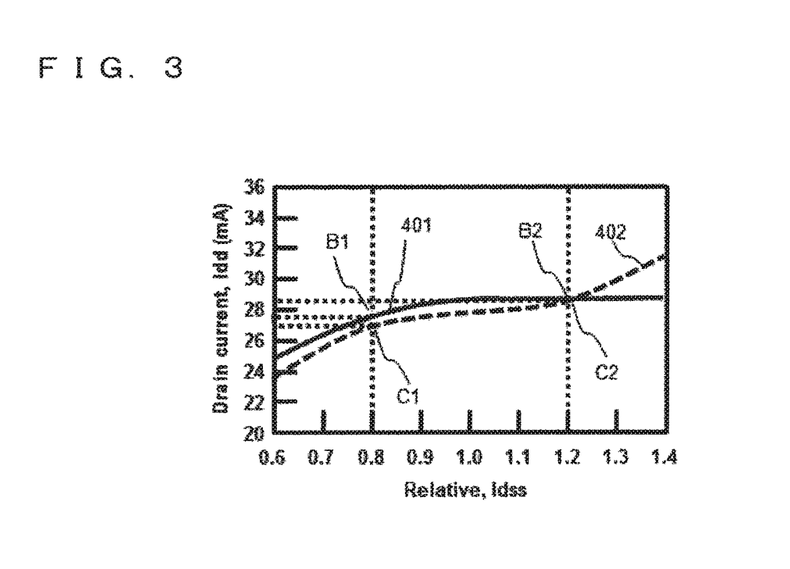
FIG. 3 A simulation result of a drain current Idd in accordance with a variation of an Idss in the circuit configuration of the current reuse type FET amplifier according to the embodiment 1.
Figure 4:
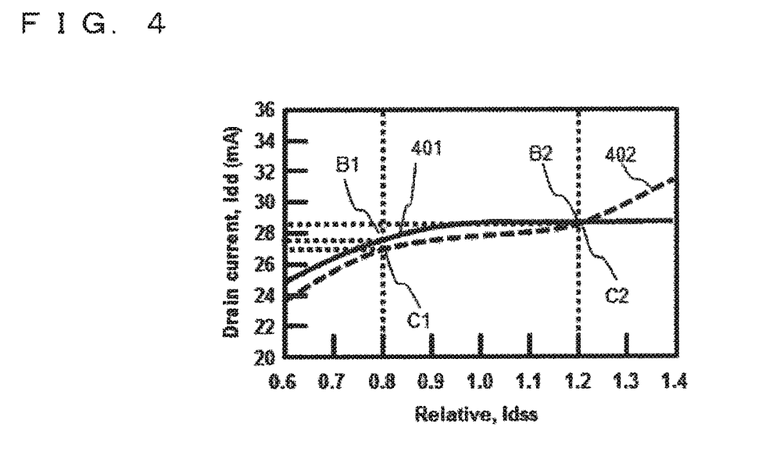
FIG. 4 A simulation result of a drain voltage of an FET 11 in accordance with the variation of the Idss in the circuit configuration of the current reuse type FET amplifier according to the embodiment 1.

FIG. 3 illustrates a simulation result of the drain current Idd in accordance with the Idss variation in the circuits in FIG. 1 and FIG. 2, and FIG. 4 illustrates a simulation result of the drain voltage in the FET 11 in accordance with the Idss variation in the circuits in FIG. 1 and FIG. 2. In FIG. 3 and FIG. 4, the characteristic 401 and the characteristic 403 show the simulation result of the circuit FIG. 1 and the characteristic 402 and the characteristic 404 show the simulation result of the comparison circuit in FIG. 2. Each of B1 to B4 and C1 to C4 indicates an intersection point of the characteristic with the Idss variation of +20%.

As illustrated in FIG. 3, the changes of the drain currents Idd in the circuits in FIG. 1 and FIG. 2 are considerably close to each other, and the variation of the drain current Idd can be considerably reduced in any of the circuit configurations.

In the meanwhile, as illustrated in FIG. 4, the voltage in the characteristic 403 changes by 0.8 V ranging from 2.8 V at the point B3 to 2V at the point B4, and the voltage in the characteristic 404 changes by 3.3 V ranging from 0.7 V at the point C3 to 4.0 V at the point C4. In a case where the drain-to-source withstand voltage of the FET 11 and the FET 12 is 3V, when the Idss increases by 20%, the voltage of 4V is applied to the FET 11, and exceeds the withstand voltage. In contrast, the voltage of the characteristic 403 changes by 2.8 at a maximum and 2.0 V at a minimum; thus it becomes possible to achieve operation within the range of the withstand voltage of 3V.

When the gain in a high frequency region is intended to be improved by reducing the gate length, the drain-to-source withstand voltage is also necessarily reduced; thus it is important in actual use to achieve the circuit configuration having the small drain voltage change as illustrated in FIG. 4. The characteristics 403 and 404 are different from each other mainly in whether or not the gate voltage is applied to the FET 12 from the control circuit unit 102.

Effect in Embodiment 1

As described above, the current reuse type FET amplifier according to the embodiment 1 changes the gate voltage of the amplifier FET or the resistance value for auto-bias of the amplifier FET in accordance with the process variation of the saturation current Idss of the FET, and thus has an effect of reducing the change of the drain current of the amplifier. Furthermore, the variation of the drain voltage of the FET in the first stage can also be reduced; thus a state where the voltage exceeds the drain-to-source DC withstand voltage of the FET corresponding to the process variation of the Idss can be prevented. The circuit configuration described above also has an effect of being able to achieve, with the positive single power source, the reduction in the variation of the drain current and the variation of the drain voltage in the first stage in the current reuse amplifier using the FET of depression mode.

Embodiment 2

FIG. 5 illustrates a circuit configuration of a current reuse type FET amplifier according to an embodiment 2 of the present invention, and is a modification example of the embodiment 1. FIG. 5 in the embodiment 2 is different from FIG. 1 in the embodiment 1 in that the resistance 33 in FIG. 1 is changed to a variable resistance made up of the FET 15 and the resistance 41 and, to control the variable resistance, a control circuit made up of a resistance 42, an FET 16 and a diode 64 is added to the control circuit unit 102. A gate of the FET 16 is connected to the source of the FET 13, and a drain of the FET 16 is connected to a gate of the FET 15 via the resistance 41 so that a drain-to-source resistance value of the FET 15 is made variable.

As described in the embodiment 1, when the Idss increases, the source voltage of the FET 13 in the control circuit unit 102 increases; thus the drain current of the FET 16 is increased. The increase in the drain current increases a voltage drop of the resistance 42; thus the gate voltage of the FET 15 is reduced. Accordingly, the drain-to-source resistance of the FET 15 is increased, source potential of the FET 12 is increased, and a drain current of the FET 12 is reduced. As a result, it can be expected that the variation of the drain current is reduced more than the variation of the drain current in accordance with the variation of the Idss in the embodiment 1. With regard to the variation of the drain voltage of the FET 11, since the gate voltage control circuit of the FET 12 is the same, the effect equivalent to the embodiment 1 can be obtained in the embodiment 2.

In FIG. 5, the control circuit made up of the FET 16, the resistance 42 and the diode 64 is newly added to control the gate voltage of the FET 15 so that a freedom degree in designing is increased. Accordingly, depending on the setting of a circuit constant, one end of the resistance 41 can be connected to the drain of the FET 14, a connection point between the diodes 62 and 63, or a connection point between the diode 63 and the resistance 38.

Note that the GaAs-based depression mode FET (including the HEMT of the high-electron-mobility transistor) is described as the example in the embodiments described above; however, the similar effect can be obtained as long as an n-type channel depression mode FET such as an InP-based FET, a GaN-based FET, and an Si-based MOSFET is applied.

Particularly, differing from the Si-based MOSFET, which is normally of enhancement mode, in the case of applying a GaAs-based FET, an InP-based FET and a GaN-based FET, an FET of depression mode is used as most products thereof; thus it is important in actual use to reduce the variation of the drain current by the present invention.

EXPLANATION OF REFERENCE SIGNS

1: RF input terminal
2: RF output terminal
3: drain power source terminal in amplification unit
4: drain power source terminal in control circuit unit
11 to 16: GaAs-based FET of depression mode
21 to 27: capacitance
31 to 41: resistance
51 to 54: transmission line
61 to 64: diode 101: amplification unit
102: control circuit unit
301, 302: drain current in accordance with Idss variation in comparison circuit
401: drain current in accordance with Idss variation in embodiment 1
402: drain current in accordance with Idss variation in comparison circuit
403: drain voltage in accordance with Idss variation in embodiment 1
404: drain voltage in accordance with Idss variation in comparison circuit

The invention claimed is:

1. A current reuse type field effect transistor amplifier, comprising:
a first field effect transistor including a first gate to which an RF signal is input, a first source, and a first drain;
a first resistance connected between the first source and a ground terminal;
a second field effect transistor including a second source, a second gate, and a second drain connected to a first power source terminal and outputting an RF signal which has been amplified;
a second resistance connected between the first drain and the second source;
a capacitance connected between the first drain and the second gate;
a third field effect transistor including a third source, a third drain connected to a second power source terminal, and a third gate connected to the ground terminal;
a fourth field effect transistor including a fourth source, a fourth drain, and a fourth gate connected to the third source;
a first diode connected between the fourth source and the ground terminal;
a third resistance connected between the second power source terminal and the fourth drain;
a fourth resistance connected between the fourth drain and the first gate; and
a fifth resistance connected between the fourth drain and the second gate, wherein
the first to fourth field effect transistors are of depression mode.

2. The current reuse type field effect transistor amplifier according to claim 1, comprising
a fifth field effect transistor in place of the second resistance, the fifth field effect transistor including a fifth gate, a fifth drain connected to the second source, and a fifth source connected to the first drain, wherein
the fifth gate is connected to the fourth drain.

3. The current reuse type field effect transistor amplifier according to claim 1, wherein
the second power source terminal is connected to the first power source terminal and communalized.

4. The current reuse type field effect transistor amplifier according to claim 1, wherein
each of the first to fourth field effect transistors is a GaAs-based, InP-based, or GaN-based composite semiconductor field effect transistor.

5. The current reuse type field effect transistor amplifier according to claim 1, comprising:
a fifth field effect transistor in place of the second resistance, the fifth field effect transistor including a fifth gate, a fifth drain connected to the second source, and a fifth source connected to the first drain;

a sixth field effect transistor including a sixth source, a sixth drain, and a sixth gate connected to the third source;

a second diode connected between the sixth source and the ground terminal; and a sixth resistance connected between the second power source terminal and the sixth drain, wherein the first to sixth field effect transistors are of depression mode.

6. The current reuse type field effect transistor amplifier according to claim 5, wherein each of the first to sixth field effect transistors is a GaAs-based, InP-based, or GaN-based composite semiconductor field effect transistor.

* * * * *